(12) United States Patent
Guerra

(10) Patent No.: US 10,049,855 B2
(45) Date of Patent: Aug. 14, 2018

(54) DETECTING CHARGED PARTICLES

(71) Applicant: Carl Zeiss Microscopy Ltd., Cambridge (GB)

(72) Inventor: Diego Guerra, Cambridge (GB)

(73) Assignee: CARL ZEISS MICROSCOPY LTD., Cambridge (GB)

( * ) Notice: Subject to any disclaimer, the term of this patent is extended or adjusted under 35 U.S.C. 154(b) by 0 days.

(21) Appl. No.: 15/364,396

(22) Filed: Nov. 30, 2016

(65) Prior Publication Data

US 2017/0162364 A1 Jun. 8, 2017

(30) Foreign Application Priority Data

Dec. 3, 2015 (EP) ..................................... 15197910

(51) Int. Cl.
*H01J 37/244* (2006.01)
*H01J 37/21* (2006.01)
(Continued)

(52) U.S. Cl.
CPC ............ *H01J 37/244* (2013.01); *H01J 37/21* (2013.01); *H01J 37/28* (2013.01);
(Continued)

(58) Field of Classification Search
CPC .................................................. H01J 37/244
(Continued)

(56) References Cited

U.S. PATENT DOCUMENTS 4,785,182 A * 11/1988 Mancuso ............... H01J 37/244
250/307
4,880,976 A * 11/1989 Mancuso ............... H01J 37/244
250/310
(Continued)

FOREIGN PATENT DOCUMENTS

EP     1 299 897 B1    4/2008
EP     2 195 822 B1    11/2011
(Continued)

OTHER PUBLICATIONS

Zeiss brochure "Zeiss GeminiSEM Family", Jena (Germany) Jun. 2015.
(Continued)

*Primary Examiner* — David A Vanore
(74) *Attorney, Agent, or Firm* — Muirhead and Saturnelli, LLC

(57) ABSTRACT

The system described herein detects charged particles which, for example, are generated by interaction of a charged particle beam with an object to be analyzed using, for example, a particle beam device. Detection is carried out for imaging of the object. The system described herein allows detection of charged particles with the same detection principle when the ambient pressures in an object chamber are in a first pressure range being lower than or equal to $10^{-3}$ hPa or in a second pressure range being equal to or above $10^{-3}$ hPa. When operating with the object chamber in the second pressure range, the system described herein generates photons in a scintillator using cascade particles gener- (Continued)

ated by using the charged particles and a gas, and detects the photons using a light detector.

20 Claims, 12 Drawing Sheets

(51) Int. Cl.
  *H01J 37/28* (2006.01)
  *H01J 37/30* (2006.01)
(52) U.S. Cl.
  CPC ... *H01J 37/3005* (2013.01); *H01J 2237/2443* (2013.01); *H01J 2237/2445* (2013.01)
(58) Field of Classification Search
  USPC ............ 250/310, 397, 311, 306, 370.11, 399
  See application file for complete search history.

(56) References Cited

U.S. PATENT DOCUMENTS

| | | | |
|---|---|---|---|
| 7,462,839 B2 | 12/2008 | Gnauck et al. | |
| 2002/0088939 A1* | 7/2002 | Hayn | H01J 37/244 250/310 |
| 2003/0010913 A1* | 1/2003 | Essers | H01J 37/244 250/310 |
| 2004/0036031 A1 | 2/2004 | Rose et al. | |
| 2004/0075053 A1 | 4/2004 | Preikszas et al. | |
| 2005/0173644 A1* | 8/2005 | Gnauck | H01J 37/244 250/370.11 |
| 2005/0230620 A1* | 10/2005 | Jacka | H01J 37/244 250/311 |
| 2006/0249686 A1* | 11/2006 | Slowko | H01J 37/244 250/397 |
| 2009/0242758 A1* | 10/2009 | Uncovsky | H01J 37/244 250/307 |
| 2011/0031394 A1* | 2/2011 | Knowles | H01J 37/301 250/307 |
| 2011/0291010 A1* | 12/2011 | Katane | H01J 37/244 250/310 |
| 2013/0187055 A1* | 7/2013 | Zadrazil | H01J 37/244 250/368 |
| 2013/0214156 A1* | 8/2013 | Kneedler | H01J 37/244 250/307 |
| 2015/0348749 A1* | 12/2015 | Lang | H01J 37/222 250/307 |
| 2016/0203944 A1* | 7/2016 | Ominami | H01J 37/16 250/310 |
| 2017/0016997 A1* | 1/2017 | Shindou | G01T 1/2008 |

FOREIGN PATENT DOCUMENTS

| | | |
|---|---|---|
| EP | 2 814 050 A1 | 12/2014 |
| WO | WO 98/22971 | 5/1998 |
| WO | WO 02/067286 A2 | 8/2002 |
| WO | WO 2009/043317 A2 | 4/2009 |

OTHER PUBLICATIONS

Markus Boese, et al., Zeiss brochure, "Novel Optical Design of Field Emission SEMs", Jena (Germany) Mar. 2015.
Crytur brochure "Scintillation Detectors for Electron Microscopy". (2009).
Everhart-Thornley ("ETSE") detectors and on company TESCAN.

* cited by examiner

DETECTING CHARGED PARTICLES

TECHNICAL FIELD

The system described herein relates to detecting charged particles which, for example, are generated by interaction of a charged particle beam with an object to be analyzed, where the charged particle beam interacts with the object by impinging on the object to provide imaging of the object. More particularly, the system described herein relates to the particle beam device being an electron beam device and/or an ion beam device.

BACKGROUND OF THE INVENTION

Particle beam devices are used for examining samples (objects) in order to obtain insights with regard to the properties and behavior of the samples under specific conditions. One type of particle beam device is an electron beam device, in particular a scanning electron microscope (also known as SEM).

In an SEM, an electron beam (primary electron beam) is generated using a beam generator. The electrons of the primary electron beam are accelerated to a predeterminable energy and focused by a beam guiding system, in particular an objective lens, onto a sample to be analyzed (i.e., an object to be analyzed). A high-voltage source having a predeterminable acceleration voltage is used for acceleration purposes. Using a deflection unit, the primary electron beam is guided in a raster-type fashion over a surface of the sample to be analyzed. In this case, the electrons of the primary electron beam interact with the material of the sample to be analyzed. In particular, interaction particles and/or interaction radiation arise(s) as a consequence of the interaction. By way of example, electrons are emitted by the sample to be analyzed (so-called secondary electrons) and electrons of the primary electron beam are backscattered at the sample to be analyzed (so-called backscattered electrons). The secondary electrons and backscattered electrons are detected and used for image generation. An image of the sample to be analyzed is thus obtained.

Furthermore, it is known from the prior art to use combination devices for processing and/or for analyzing a sample, wherein both electrons and ions can be guided onto a sample to be processed and/or to be analyzed. By way of example, it is known for an SEM to be additionally equipped with an ion beam column. Using an ion beam generator arranged in the ion beam column, ions are generated which are used for processing a sample (for example for removing a layer of the sample or for depositing material on the sample, wherein the material is provided by a gas injection system) or else for imaging. In this case, the SEM serves, in particular, for observing the processing, but also for further analysis of the processed or non-processed sample. Electrons may also be used for depositing material. This is known as Electron Beam Induced Deposition (EBID).

It is known in the prior art to use a so-called Everhart-Thornley detector (ETD) for detecting the above-mentioned interaction particles, namely the secondary electrons and/or backscattered electrons in an SEM. The ETD comprises an extraction grid, a scintillator and a light detector. The secondary electrons or backscattered electrons are attracted away from the sample to the ETD by the extraction grid and are accelerated to the scintillator having a high voltage of about 10 kV. When the highly kinetic electrons impinge on the scintillator, photons are generated which are detected by the light detector, for example a photomultiplier.

The ETD is used when the ambient pressure of the ETD is lower than or equal to $10^{-3}$ hPa. The ambient pressure is, for example, the pressure in an object chamber of a particle beam device in which a sample to be analyzed is arranged. For example, the ambient pressure of the ETD is at high vacuum, which is the pressure range of $10^{-3}$ hPa to $10^{-7}$ hPa. When the ambient pressure of the ETD is above $10^{-3}$ hPa, increased conductivity of residual gas leads to overstrikes (hereinafter also called breakdowns) due to the high voltage applied to the scintillator.

Therefore, such an ETD may not be used in a particle beam device in which the ambient pressure of the ETD may be varied to a pressure of higher than $10^{-3}$ hPa. Such a particle beam device is also known as a variable pressure particle beam device, for example a variable pressure SEM.

It is known to use an indirect detection of the secondary electrons at ambient pressures above $10^{-3}$ hPa in an object chamber of a particle beam device. The indirect detection comprises applying an extraction potential of up to 1000 V to an electrode in order to accelerate the secondary electrons toward the electrode and away from the sample. A charged particle cascade in the form of an to electron cascade results from collisions of the secondary electrons with gas molecules of a gas, for example ambient air in the object chamber. Tertiary electrons arise in this charged particle cascade, and photons are also generated from scintillation effects. Signal detection takes place either by the measurement of the electron current of the tertiary electrons or by the detection of the generated photons.

A particle beam device is known which may be operated in a first operation mode and in a second operation mode. In the first operation mode, the particle beam device is operated at ambient pressures in the object chamber equal to or lower than $10^{-3}$ hPa, for example at high vacuum conditions or ultra-high vacuum conditions. In the second operation mode, the particle beam device is operated at variable pressure conditions in the object chamber, i.e. at ambient pressures in the object chamber equal to or above $10^{-3}$ hPa. However, the known particle beam device has to have different detectors for the first operation mode and for the second operation mode. Therefore, the known particle beam device comprises a first detector used in the first operation mode and a second detector used in the second operation mode. Having different detectors increases the costs of such a particle beam device. Additionally, the different detectors require a certain amount of space in the particle beam device which might otherwise be used for other units of the particle beam device or which could be saved. Moreover, since the different detectors may not have an identical orientation towards the sample to be analyzed, errors might occur in the analysis of the sample.

A detector for an SEM has been developed to avoid the necessity to use two different detectors in the two different operation modes mentioned above. The known detector detects both electrons and light. The detector comprises a collector grid, a scintillator and a light detector, wherein the scintillator is of a material transmissive for visible light arranged in front of the light detector. The scintillator may be provided with a coating transparent to visible light. In the first operation mode, the operation of the known detector is analogous to the mode of operation of an ETD. A high potential between 5 kV and 15 kV is applied to the scintillator so that the high-energy secondary electrons and backscattered electrons impinge on the scintillator and generate photons in the scintillator. The photons are detected by the light detector. In the second operation mode, a potential between 50 V and 1000 V is applied to the collector grid and/or the scintillator. The secondary electrons or backscattered electrons generated by the interaction of the primary particle beam with the sample generate an electron cascade in a gas with scintillation effects on the path from the sample to the scintillator or collector grid. The photons generated in the electron cascade pass through the scintillator and are detected by the light detector. Although the known detector offers a detection of charged particles in the first operation mode as well as in the second operation mode, the use of such a detector may be disadvantageous since the detection principles in the first operation mode and in the second operation mode differ from each other such that errors might occur in the analysis of the sample to be analyzed. Moreover, the known detector may suffer from reduced performance in the first and second operation mode compared to using two dedicated detectors for the two operation modes.

As regards prior art, reference is made in particular to patent documents U.S. Pat. No. 4,785,182 A, WO 98/22971 A2 as well as U.S. Pat. No. 7,462,839 B2, both of which are incorporated by reference herein.

In light of the aforesaid, it is desirable to provide a mechanism that detects charged particles with the same detection principle when the ambient pressures in the object chamber are equal to or above $10^{-3}$ hPa as well as lower than $10^{-3}$ hPa.

SUMMARY OF THE INVENTION

The system described herein allows detecting charged particles which, for example, are generated by interaction of a charged particle beam with an object to be analyzed, wherein the charged particle beam interacts with the object by impinging on the object. The detecting is carried out, in particular, for imaging of the object. The charged particles may be secondary particles and/or backscattered particles, in particular, secondary electrons and/or backscattered electrons.

The system described herein uses at least one detector arranged in an object chamber, for example an object chamber of a particle beam device. The object chamber is operated in a first pressure range or in a second pressure range, wherein the first pressure range only includes pressures lower than or equal to $10^{-3}$ hPa and wherein the second pressure range only includes pressures equal to or over $10^{-3}$ hPa. For example, the first pressure range may include pressures of high-vacuum conditions or ultra-high vacuum conditions. The detector includes at least one collector electrode, at least one scintillator and at least one light detector. The scintillator may be arranged between the collector electrode and the light detector. The light detector may be a photomultiplier.

The system described herein also includes, when operating the object chamber in the second pressure range, generating photons in the scintillator using cascade particles generated by the charged particles in a gas, and detecting the photons using the light detector. The gas may be ambient air in the object chamber.

The system described herein allows for detecting charged particles with the same detection principle when the ambient pressures in the object chamber are equal to or above $10^{-3}$ hPa as well as lower than $10^{-3}$ hPa.

When having an ambient pressure equal to or lower than $10^{-3}$ hPa in the object chamber, the detector is used in a manner analogous to the mode of operation of an ETD. The charged particles are accelerated in the direction of the scintillator by the collector electrode. A high potential, for example a potential between 5 kV and 15 kV, is applied to the scintillator so that the charged particles, for example secondary electrons and backscattered electrons, impinge on the scintillator and generate photons in the scintillator. The photons are detected using the light detector. Detection signals are generated and are used, for example, for imaging of the object.

When having ambient pressures in the object chamber equal to or above $10^{-3}$ hPa, the identical detection principle is used. Charged particles, in particular, high energy charged particles, for example backscattered electrons having an energy above approximately 1 keV, travelling in the direction of the scintillator generate photons in the scintillator when impinging on the scintillator. The photons are detected using the light detector. Detection signals are generated and are used, for example, for imaging of the object. Furthermore, charged particles, in particular, low energy charged particles, for example secondary electrons having an energy lower than approximately 1 keV, are accelerated to the collector electrode, collide with gas molecules of a gas, for example ambient air, in the object chamber and generate a particle cascade. Cascade particles, in particular, cascade charged particles (for example tertiary electrons), arise in this particle cascade. For example, due to the amplification process in the particle cascade, the final number of cascade charged particles is, for example, about 1000 times higher than the initial number of secondary particles (in particular secondary electrons) emitted from the object. The cascade charged particles are accelerated to the scintillator by the collector electrode and generate photons in the scintillator when impinging on the scintillator. The photons are detected using the light detector. Again, detection signals are generated and are used, for example, for imaging of the object.

The operational capability of the detection of charged particles by generating cascade charged particles was verified by operating the above mentioned detector in an ambient pressure of water vapor, wherein the detector was arranged in an object chamber. The pressure of the chamber was 30 Pa of water vapor at room temperature. Photons generated due to a scintillation process in the particle cascade in water vapor have a specific wavelength of about 310 nm. Additionally, a scintillator composed of P-47 was used. Photons generated in such a scintillator have energies with a center wavelength of about 410 nm. Moreover, an optical filter was arranged between the scintillator and the light detector. The optical filter was a B-440 filter provided by HOYA Corporation USA. This optical filter has an approximate 40% transmission for wavelengths at 410 nm and an almost zero transmission at about 310 nm. It has been shown that only photons generated in the scintillator are detected by the light detector.

One embodiment of the system described herein additionally or alternatively provides that a variable scintillator voltage is applied to the scintillator. The variable scintillator voltage is chosen from a range of 200 V to 10 kV. However, the invention is not restricted to this range. Instead, any suitable voltage may be chosen for the variable scintillator voltage.

A further embodiment of the system described herein additionally or alternatively provides the step of choosing a first value of the variable scintillator voltage from a first database. No breakdown in the object chamber occurs at the first value of the variable scintillator voltage. Additionally or alternatively, a charged particle amplification using a particle cascade in the gas occurs at the first value of the variable scintillator voltage. For example, the first value of the variable scintillator voltage is determined by an experimental study and is dependent on the ambient pressure in the object chamber. Therefore, there exist several first values of the variable scintillator voltage, wherein each first value of the variable scintillator voltage corresponds to a specific ambient pressure value. Each first value of the variable scintillator voltage and its corresponding ambient pressure value are stored in the first database and may be chosen as mentioned above after having been stored. For example, the first value of the variable scintillator voltage is loaded into a first power supply device controlling the variable scintillator voltage. After loading, the variable scintillator voltage is set to the first value.

Another embodiment of the system described herein additionally or alternatively provides that a variable collector voltage is applied to the collector electrode. The variable collector voltage is chosen from a range of 0V to 1 kV. However, the invention is not restricted to this range. Instead, any suitable voltage may be chosen for the variable collector voltage.

An embodiment of the system described herein additionally or alternatively provides the step of choosing a second value of the variable collector voltage from a second database. No breakdown in the object chamber occurs at the second value of the variable collector voltage. Additionally or alternatively, a charged particle amplification using a particle cascade in the gas occurs at the second value of the variable collector voltage. For example, the second value of the variable collector voltage is determined by an experimental study and depending on the ambient pressure in the object chamber and/or the first value of the variable scintillator voltage. Therefore, there exist several second values of the variable collector voltage, wherein each second value of the variable collector voltage corresponds to a specific ambient pressure value and/or to a specific first value of the variable scintillator voltage. Each second value of the variable collector voltage and its corresponding ambient pressure value and/or corresponding first value of the variable scintillator voltage are stored in the second database and may be chosen as mentioned above after having been stored. For example, the second value of the variable collector voltage is loaded into a second power supply device controlling the variable collector voltage. After loading, the variable collector voltage is set to the second value.

The first database and the second database may be different databases. Alternatively, the first database and the second database may be identical. Therefore, a single database may include the first database and the second database.

An embodiment of the system described herein additionally or alternatively provides that charged particles in the form of interaction particles, in particular electrons are detected. For example, secondary electrons are detected.

The system described herein also includes a computer program product having a program code which may be loaded or is loaded into a processor and which, when being executed, controls a particle beam device in such a way that a method including at least one of the above mentioned or further below mentioned steps or a combination of at least two of the above mentioned or further below mentioned steps is carried out.

The system described herein also includes a particle beam device having at least one beam generator for generating a primary particle beam having primary charged particles and at least one object chamber. The particle beam device also has at least one objective lens for focusing the primary particle beam on an object. Moreover, the particle beam device includes at least one detector for detecting interaction particles which are generated when the primary particle beam impinges on the object. The interaction particles may be secondary particles and/or backscattered particles, in particular, secondary electrons and backscattered electrons. The detector is arranged in the object chamber and includes at least one collector electrode, at least one scintillator, and at least one light detector. The scintillator is arranged between the collector electrode and the light detector. The light detector may be a photomultiplier. Moreover, the particle beam device includes at least one processor into which a computer program product as above mentioned is loaded.

In an embodiment of the particle beam device according to the system described herein, it is additionally or alternatively provided that the beam generator is a first beam generator for generating a first primary particle beam having first primary charged particles. Moreover, the particle beam device may further include at least one second beam generator for generating a second primary particle beam having second primary charged particles.

In a further embodiment of the particle beam device according to the system described herein, it is additionally or alternatively provided that the detector is a first detector and that the particle beam device includes at least one second detector for detecting at least one of: interaction particles and interaction radiation which are generated when the primary particle beam impinges on the object. The interaction particles may be secondary particles and/or backscattered particles, for example secondary electrons and backscattered electrons. The interaction radiation may be X-rays or cathodoluminescence light.

In an embodiment of the particle beam device according to the system described herein, it is additionally or alternatively provided that the particle beam device is at least one of the following: an electron beam device or an ion beam device. In particular, the particle beam device may be both an electron beam device and an ion beam device.

BRIEF DESCRIPTION OF THE DRAWINGS

Embodiments of the system described herein will be explained in more detail in the following text with reference to the figures, in which.

DETAILED DESCRIPTION OF VARIOUS EMBODIMENTS

Figure 1:
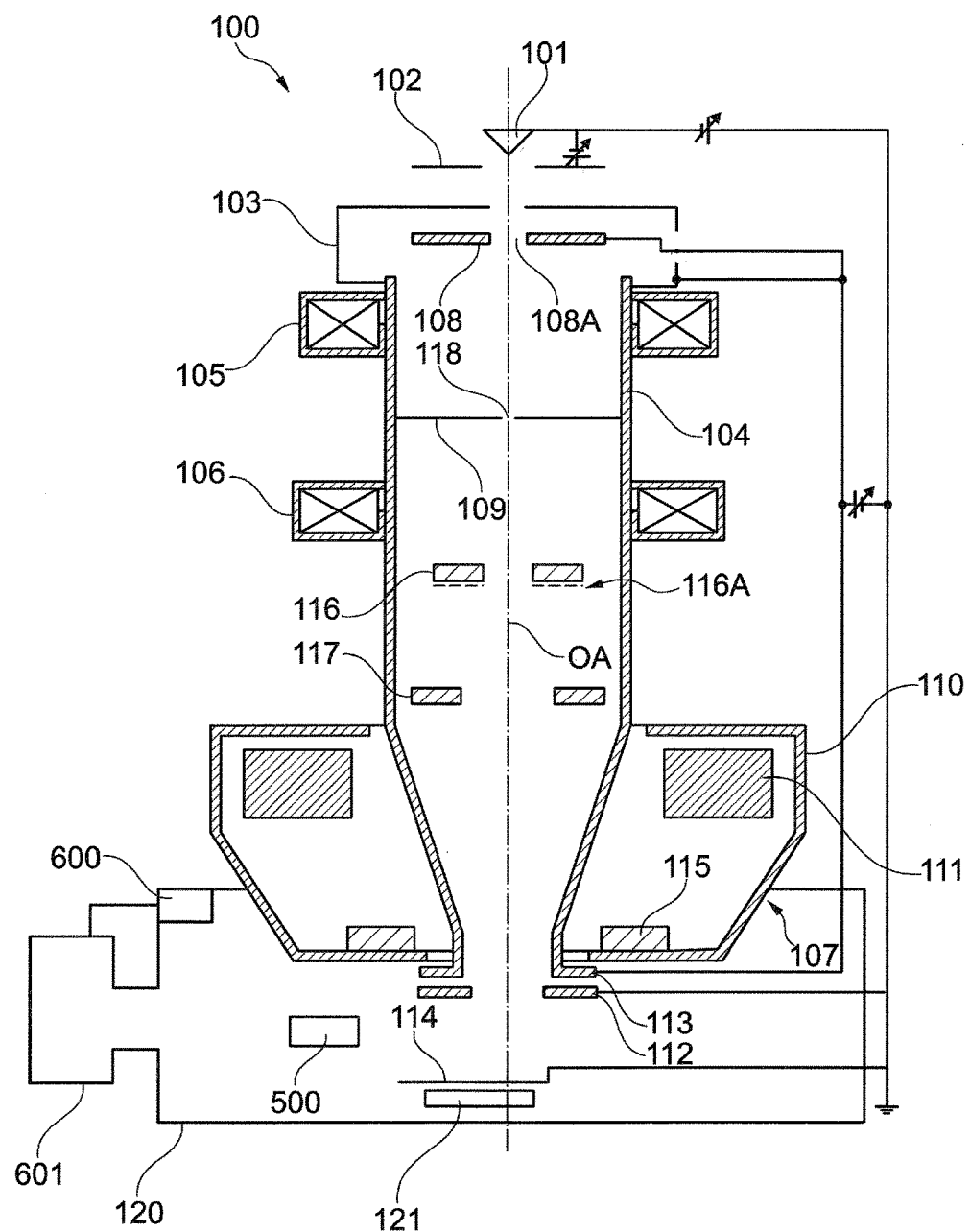
FIG. 1 shows a schematic representation of a first embodiment of a particle beam device.

FIG. 1 shows a schematic representation of an SEM 100. The SEM 100 has a beam generator in the form of an electron source 101 being a cathode, an extraction electrode 102, and an anode 103 which is arranged on the end of a beam guide tube 104 of the SEM 100. The electron source 101 is, for example, a thermal field emitter. However, the invention is not limited to such an electron source. Instead, any electron source may be used.

Electrons emerging from the electron source 101 form a primary electron beam. The electrons are accelerated to an anode potential due to a potential difference between the electron source 101 and the anode 103. The anode potential in this exemplary embodiment is between 0.2 kV and 30 kV relative to the ground potential of an object chamber 120, for example, 5 kV to 15 kV, in particular 8 kV, but alternatively, it could also be at ground potential.

Two condenser lenses are arranged at the beam guide tube 104, i.e., a first condenser lens 105 and a second condenser lens 106, the first condenser lens 105 being situated first, and then the second condenser lens 106, as viewed from the electron source 101 toward an objective lens 107. However, the invention is not limited to the use of two condenser lenses. Instead, further embodiments may comprise only a single condenser lens.

A first aperture unit 108 is arranged between the anode 103 and the first condenser lens 105. The first aperture unit 108 is, together with the anode 103 and the beam guide tube 104, at high-voltage potential, i.e. the potential of the anode 103, or at ground. The first aperture unit 108 may have several first aperture openings 108A. One of those first aperture openings 108A is shown in FIG. 1. For example, the first aperture unit 108 has two first aperture openings 108A. Each of the several first aperture openings 108A may have a different opening diameter. A chosen first aperture opening 108A may be arranged at an optical axis OA of the SEM 100 using an adaption mechanism. However, the invention is not limited to this embodiment. Instead, in an alternative embodiment, the first aperture unit 108 may have a single first aperture opening 108A only. No adaption mechanism is used for this alternative embodiment. The first aperture unit 108 of this alternative embodiment is fixedly arranged around the optical axis OA.

A stationary second aperture unit 109 is arranged between the first condenser lens 105 and the second condenser lens 106. Alternatively, the second aperture unit 109 is moveable.

The objective lens 107 has pole pieces 110, in which a bore has been made. The beam guide tube 104 is arranged and guided through this bore. Further, a coil 111 is arranged in the pole pieces 110.

An electrostatic deceleration device is situated downstream from the beam guide tube 104. The deceleration device has a single electrode 112 and a tube electrode 113 arranged at the end of the beam guide tube 104 facing an object 114. Consequently, the tube electrode 113 is, together with the beam guide tube 104, at the potential of the anode 103, while the single electrode 112 and the object 114 are at a lower potential than that of the anode 103. In this case, the lower potential is the ground potential of the object chamber 120. Thus, the electrons of the primary electron beam may be decelerated to the desired energy required for analyzing the object 114.

In addition, the SEM 100 has a scanning device 115, via which the primary electron beam may be deflected and scanned across the object 114. In this process, the electrons of the primary electron beam interact with the object 114. As a consequence of this interaction, interaction particles and/or interaction radiation will result, which are detected. The detection signals obtained in this manner are evaluated.

As interaction particles, in particular electrons, are emitted from the surface of the object 114 (so-called secondary electrons) or electrons of the primary electron beam are scattered back (so-called backscattered electrons). For detecting secondary electrons and/or backscattered electrons, a detector system which has a first detector 116 and a second detector 117 is arranged in the beam guide tube 104. The first detector 116 is arranged on the source-side along the optical axis OA, while the second detector 117 is arranged on the object-side along the optical axis OA in the beam guide tube 104. In addition, the first detector 116 and the second detector 117 are arranged offset against each other toward the optical axis OA of the SEM 100. Both the first detector 116 and the second detector 117 each have a through opening through which the primary electron beam may pass, and the detectors 116, 117 are approximately at the potential of the anode 103 and the beam guide tube 104. The optical axis OA of the SEM 100 passes through the corresponding through openings.

The second detector 117 is used to detect mostly secondary electrons. Secondary electrons emitting from the object 114 have a low kinetic energy and arbitrary direction of movements. However, the secondary electrons are accelerated due to a strong extraction field generated by the tube electrode 113 in the direction of the objective lens 107. The secondary electrons enter the objective lens 107 nearly parallel to the optical axis OA. A diameter of the beam bunch of the secondary electrons is small in the objective lens 107. The objective lens 107, however, affects the beam of secondary electrons and generates a short focus of the secondary electrons having relatively steep angles with respect to the optical axis OA such that the secondary electrons diverge from each other after the focus and may impinge on the second detector 117. Electrons backscattered on the object 114, i.e. backscattered electrons, have a relatively high kinetic energy as compared to secondary electrons when exiting from the object 114. Backscattered electrons are detected only to a very small degree by the second detector 117. The high kinetic energy and the angle of the beam of backscattered electrons with respect to the optical axis OA when backscattered at the object 114 result in a beam waist, i.e. a beam area having a minimal diameter, of the backscattered electrons, the beam waist being arranged in the vicinity of the second detector 117. Therefore, a large part of the backscattered electrons passes through the opening of the second detector 117. Accordingly, the first detector 116 is mainly used for detecting backscattered electrons.

The first detector 116 of a further embodiment of the SEM 100 may have an opposing field grid 116A which is a field grid with an opposing potential. The opposing field grid 116A may be arranged at the side of the first detector 116 facing the object 114. The opposing field grid 116A may include a negative potential with respect to the potential of the beam guide tube 104 such that mainly or only backscattered electrons having a high energy may pass the opposing field grid 116A and impinge on the first detector 116. Additionally or alternatively, the second detector 117 may have a further opposing field grid being designed similar to the above mentioned opposing field grid 116A of the first detector 116 and having an analog function.

The detection signals generated by the first detector 116 and the second detector 117 are used to generate an image or images of the surface of the object 114. It is pointed out expressly that the aperture openings of the first aperture unit 108 and the second aperture unit 109 as well as the through openings of the first detector 116 and the second detector 117 are represented in an exaggerated manner in the figures. The through openings of first detector 116 and the second detector 117 have a maximum length of between 1 mm and 5 mm perpendicular to the optical axis OA. For example, the openings have a circular design and a diameter in the range of 1 mm to 3 mm perpendicular to the optical axis OA.

In the exemplary embodiment shown here, the second aperture unit 109 is a circular aperture having a second aperture opening 118 for the primary electron beam to pass through, the second aperture opening 118 having an extension in the range of 25 µm to 50 µm, for example, 35 µm. The second aperture unit 109 may be a pressure stage aperture. The second aperture unit 109 of a further exemplary embodiment may have several openings which may be mechanically moved with respect to the primary electron beam or which may be passed through by the primary electron beam using electrical and/or magnetic deflection devices. As above mentioned, the second aperture unit 109 may also be a pressure stage unit. The second aperture unit 109 separates a first area, in which the electron source 101 is arranged, having an ultra-high vacuum ($10^{-7}$ to $10^{-12}$ hPa), from a second area with a high vacuum ($10^{-3}$ to $10^{-7}$ hPa). The second area is the intermediate pressure area of the beam guide tube 104 leading to the object chamber 120.

In addition to the detector system mentioned above, the SEM 100 has an analysis detector 500 which is arranged in the object chamber 120. The analysis detector 500 is, for example, positioned between the beam guide tube 104 and the object 114. Moreover, the analysis detector 500 is positioned at the side of the object 114. The structure of the analysis detector 500 is explained further below.

The object chamber 120 is operated in a first pressure range or in a second pressure range, wherein the first pressure range only comprises pressures lower than or equal to $10^{-3}$ hPa and wherein the second pressure range only comprises pressures equal to or over $10^{-3}$ hPa. A pressure sensor 600 is arranged in the object chamber 120 for measuring the pressure in the object chamber 120. A pump system 601 being connected to the pressure sensor 600 and being arranged at the object chamber 120 provides for the pressure range, either the first pressure range or the second pressure range, in the object chamber 120.

The SEM 100 may further have a third detector 121 which is arranged in the object chamber 120. The third detector 121 is arranged downstream of the object 114 as seen from the electron source 101 in the direction of the object 114 along the optical axis OA. The primary electron beam may be transmitted through the object 114. Electrons of the primary electron beam interact with the material of the object 114. Electrons transmitted through the object 114 are detected using the third detector 121.

Figure 1A:
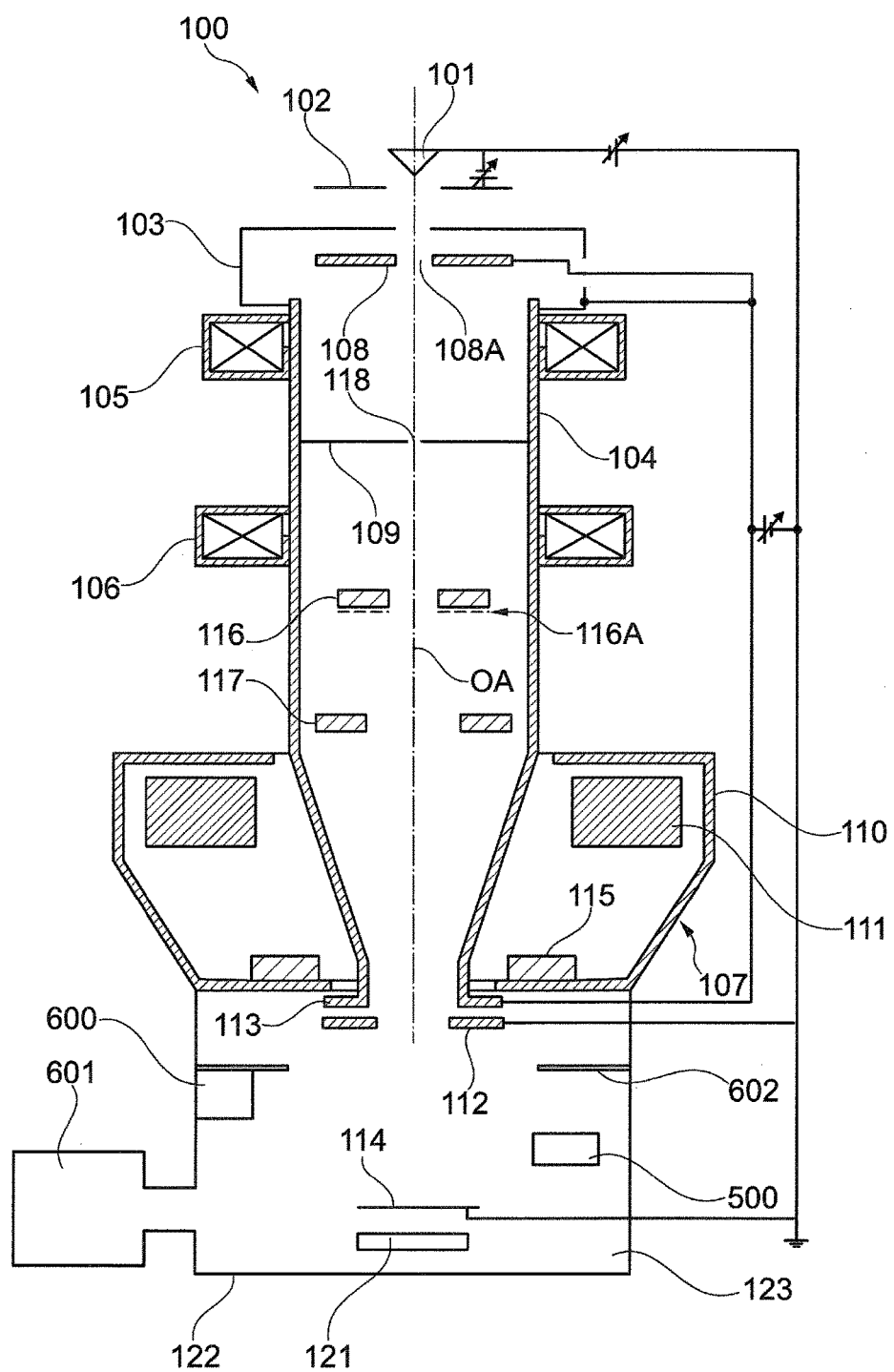
FIG. 1A shows a schematic representation of a second embodiment of a particle beam device.

FIG. 1A shows a schematic representation of a further SEM 100. The embodiment of FIG. 1A is based on the embodiment of FIG. 1. Identical reference signs denote identical components. In contrast to the SEM 100 of FIG. 1, the SEM 100 of FIG. 1A includes an object chamber 122. A pressure limiting aperture 602 is arranged between the beam guide tube 104 and an object area 123 of the object chamber 122. The SEM 100 according to FIG. 1A is suited in particular for the SEM 100 being operated in the second pressure range.

Figure 2:
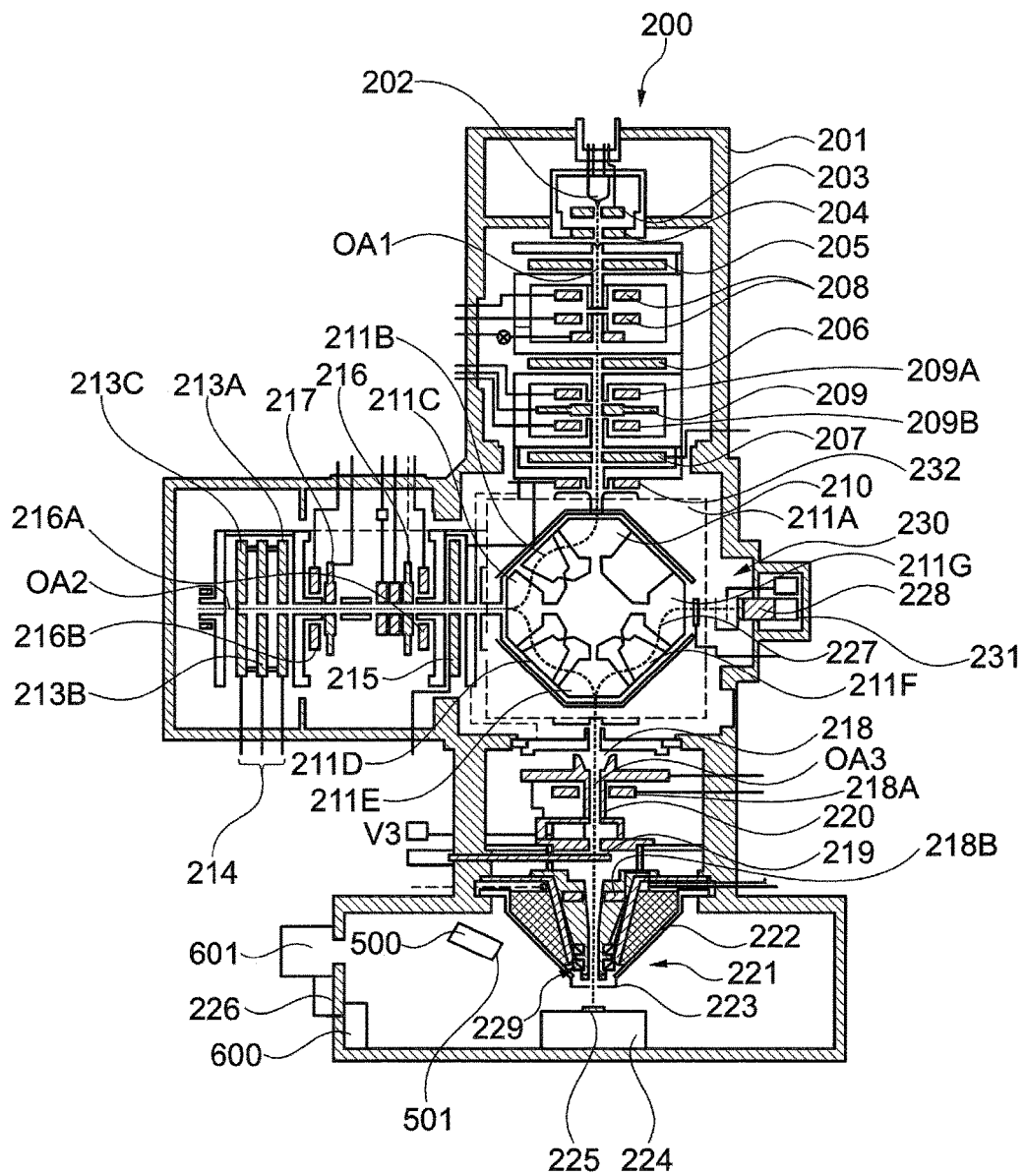
FIG. 2 shows a schematic representation of a third embodiment of a particle beam device.

FIG. 2 is a schematic illustration of a further embodiment of a particle beam device according to the system described herein. This embodiment of the particle beam device is denoted with reference sign 200 and includes a mirror corrector for correcting, for example, chromatic and spherical aberrations. This will be explained in detail further below. The particle beam device 200 includes a particle beam column 201 being embodied as an electron beam column and, in principle, corresponds to an electron beam column of a corrected SEM. However, the particle beam device 200 according to system described herein is not restricted to an SEM with a mirror corrector. Rather, any particle beam device comprising correction units may be used.

The particle beam column 201 comprises a beam generator in the form of an electron source 202 being a cathode, an extraction electrode 203 and an anode 204. By way of example, the electron source 202 may be a thermal field emitter. Electrons which emerge from the electron source 202 are accelerated by the anode 204 as a result of a potential difference between the electron source 202 and the anode 204. Accordingly, a primary particle beam in the form of an electron beam is provided along a first optical axis OA1.

The primary particle beam is guided along a beam path which—after the primary particle beam has emerged from the electron source 202—is approximately the first optical axis OA1, using a first electrostatic lens 205, a second electrostatic lens 206 and a third electrostatic lens 207.

The primary particle beam is adjusted along the beam path using at least one beam alignment device. The beam alignment device of this embodiment includes a gun alignment unit having two magnetic deflection units 208 arranged along the first optical axis OA1. Furthermore, the particle beam device 200 includes electrostatic beam deflection units. A first electrostatic beam deflection unit 209 is arranged between the second electrostatic lens 206 and the third electrostatic lens 207. The first electrostatic beam deflection unit 209 is also arranged downstream of the magnetic deflection units 208. A first multipole unit 209A in the form of a first magnetic deflection unit is arranged at one side of the first electrostatic beam deflection unit 209. Furthermore, a second multipole unit 209B in the form of a second magnetic deflection unit is arranged at the other side of the first electrostatic beam deflection unit 209. The first electrostatic beam deflection unit 209, the first multipole unit 209A and the second multipole unit 209B are used for adjusting the primary particle beam with respect to an axis of the third electrostatic lens 207 and an entrance window of a beam deflection device 210. The first electrostatic beam deflection unit 209, the first multipole unit 209A and the second multipole unit 209B may act together as a Wien filter. A further magnetic deflection device 232 is arranged at the entrance of the beam deflection device 210.

The beam deflection device 210 is used as a particle-optical beam splitter which deflects the primary particle beam in a specific way. The beam deflection device 210 includes several magnetic sectors, namely a first magnetic sector 211A, a second magnetic sector 211B, a third magnetic sector 211C, a fourth magnetic sector 211D, a fifth magnetic sector 211E, a sixth magnetic sector 211F and a seventh magnetic sector 211G. The primary particle beam enters the beam deflection device 210 along the first optical axis OA1 and is deflected by the beam deflection device 210 in the direction of a second optical axis OA2. The beam deflection is provided by the first magnetic sector 211A, the second magnetic sector 211B and the third magnetic sector 211C at an angle of 30° to 120°. The second optical axis OA2 is arranged at an identical angle to the first optical axis OA1. The beam deflection device 210 also deflects the primary particle beam which is guided along the second optical axis OA2 in the direction of a third optical axis OA3. The beam deflection is provided by the third magnetic sector 211C, the fourth magnetic sector 211D and the fifth magnetic sector 211E. In the embodiment shown in FIG. 2, deflecting to the second optical axis OA2 and to the third optical axis OA3 will be done by deflecting the primary particle beam at an angle of 90°. Thus, the third optical axis OA3 runs coaxially to the first optical axis OA1. However, the particle beam device 200, according to the system described herein, is not restricted to deflection angles of 90°. Instead, any suitable deflection angle may be used with the beam deflection device 210, for example 70° or 110° such that the first optical axis OA1 does not run coaxially to the third optical axis OA3. For further details of the beam deflection device 210, reference is made to WO 2002/067286 A2, which is incorporated herein by reference.

After being deflected by the first magnetic sector 211A, the second magnetic sector 211B and the third magnetic sector 211C, the primary particle beam is guided along the second optical axis OA2. The primary particle beam is guided to an electrostatic mirror 214 and passes—on the way to the electrostatic mirror 214—a fourth electrostatic lens 215, a third multipole unit 216A in the form of a magnetic deflection unit, a second electrostatic beam deflection unit 216, a third electrostatic beam deflection unit 217 and a fourth multipole unit 216B in the form of a magnetic deflection unit. The electrostatic mirror 214 includes a first mirror electrode 213A, a second mirror electrode 213B and a third mirror electrode 213C. Electrons of the primary particle beam which are reflected back by the electrostatic mirror 214 run again along the second optical axis OA2 and enter again the beam deflection device 210. The electrons are deflected by the third magnetic sector 211C, the fourth magnetic sector 211D and the fifth magnetic sector 211E towards the third optical axis OA3. The electrons of the primary particle beam exit the beam deflection device 210, being guided along the third optical axis OA3 to the object 225 to be examined. On its way to the object 225, the primary particle beam passes a fifth electrostatic lens 218, a beam guiding tube 220, a fifth multipole unit 218A, a sixth multipole unit 218B and an objective lens 221. The fifth electrostatic lens 218 is an electrostatic immersion lens. The primary particle beam is decelerated or accelerated by the fifth electrostatic lens 218 to the electrical potential of the beam guiding tube 220.

The primary particle beam is focused by the objective lens 221 in a focal plane in which the object 225 is positioned. The object 225 is arranged on a movable sample stage 224. The movable sample stage 224 is arranged in an object chamber 226 of the particle beam device 200.

The objective lens 221 may be implemented as a combination of a magnetic lens 222 and a sixth electrostatic lens 223. The end of the beam guiding tube 220 may be one electrode of an electrostatic lens. Particles of the primary particle beam, after exiting from the beam guiding tube 220, are decelerated to the potential of the object 225 arranged on the sample stage 224. The objective lens 221 is not restricted to a combination of the magnetic lens 222 and the sixth electrostatic lens 223. Instead, the objective lens 221 may be implemented in any suitable form. In particular, the objective lens 221 may also be just a mere magnetic lens or just a mere electrostatic lens.

The primary particle beam focused on the object 225 interacts with the object 225. Interaction particles and interaction radiation are generated. In particular, secondary electrons are emitted by the object 225 and backscattered electrons are returned from the object 225. The secondary electrons and the backscattered electrons are again accelerated and are guided into the beam guiding tube 220 along the third optical axis OA3. In particular, the secondary electrons and backscattered electrons travel on the beam path of the primary particle beam in the opposite direction of the primary particle beam.

The particle beam device 200 includes a first detector 219 which is arranged along the beam path between the beam deflection device 210 and the objective lens 221. Secondary electrons which are guided in directions oriented at large angles with respect to the third optical axis OA3 are detected by the first detector 219. However, backscattered electrons and secondary electrons which are guided in directions having a small axial distance with respect to the third optical axis OA3 at the first detector 219, i.e. backscattered electrons and secondary electrons having a small distance to the third optical axis OA3 at the position of the first detector 219, enter the beam deflection device 210 and are deflected by the fifth magnetic sector 211E, the sixth magnetic sector 211F and the seventh magnetic sector 211G along a detection beam path 227 to a second detector 228 of an analysis unit 231. The total deflection angle may be, for example, 90° or 110°.

The first detector 219 generates detection signals mostly based on the emitted secondary electrons. The second detector 228 generates detection signals mostly based on backscattered electrons. The detection signals generated by the first detector 219 and the second detector 228 are transmitted to an electronic unit (not shown) and are used to obtain information about the properties of the interaction area of the focused primary particle beam with the object 225. If the focused primary particle beam is scanned over the object 225 using a scanning device 229, and if the electronic unit acquires and stores the detection signals generated by the first detector 219 and the second detector 228, an image of the scanned area of the object 225 can be acquired and displayed by the electronic unit.

A filter electrode 230 may be arranged in front of the second detector 228. The filter electrode 230 may be used to separate the secondary electrons from the backscattered electrons due to the kinetic energy difference of the secondary electrons and of the backscattered electrons.

In addition to the first detector 219 and the second detector 228, the particle beam device 200 also has an analysis detector 500 which is arranged in the object chamber 226. The analysis detector 500 is positioned at the side of the object 225 and is directed with a detection surface 501 to the object 225. The structure of the analysis detector 500 is also explained further below.

The object chamber 226 is operated in a first pressure range or in a second pressure range, wherein the first pressure range only includes pressures lower than or equal to $10^{-3}$ hPa and wherein the second pressure range only includes pressures equal to or over $10^{-3}$ hPa. A pressure sensor 600 is arranged in the object chamber 226 for measuring the pressure in the object chamber 226. A pump system 601 being connected to the pressure sensor 600 and being arranged at the object chamber 226 provides for the pressure range in the object chamber 226, either the first pressure range or the second pressure range.

Figure 3:
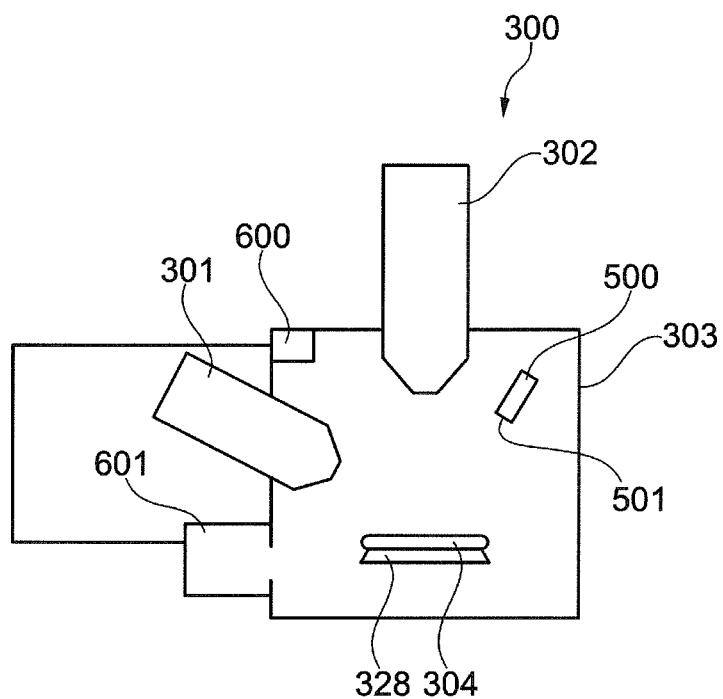
FIG. 3 shows a schematic representation of a fourth embodiment of a particle beam device.

FIG. 3 shows a schematic illustration of another embodiment of a particle beam device 300 according to the system described herein. The particle beam device 300 has a first particle beam column 301 in the form of an ion beam column, and a second particle beam column 302 in the form of an electron beam column. The first particle beam column 301 and the second particle beam column 302 are arranged on an object chamber 303, in which an object 304 to be analyzed and/or processed is arranged. It is explicitly noted that the system described herein is not restricted to the first particle beam column 301 being in the form of an ion beam column and the second particle beam column 302 being in the form of an electron beam column. In fact, the system described herein also provides for the first particle beam column 301 to be in the form of an electron beam column and for the second particle beam column 302 to be in the form of an ion beam column. A further embodiment of the system described herein provides for both the first particle beam column 301 and the second particle beam column 302 each to be in the form of an ion beam column.

Figure 4:
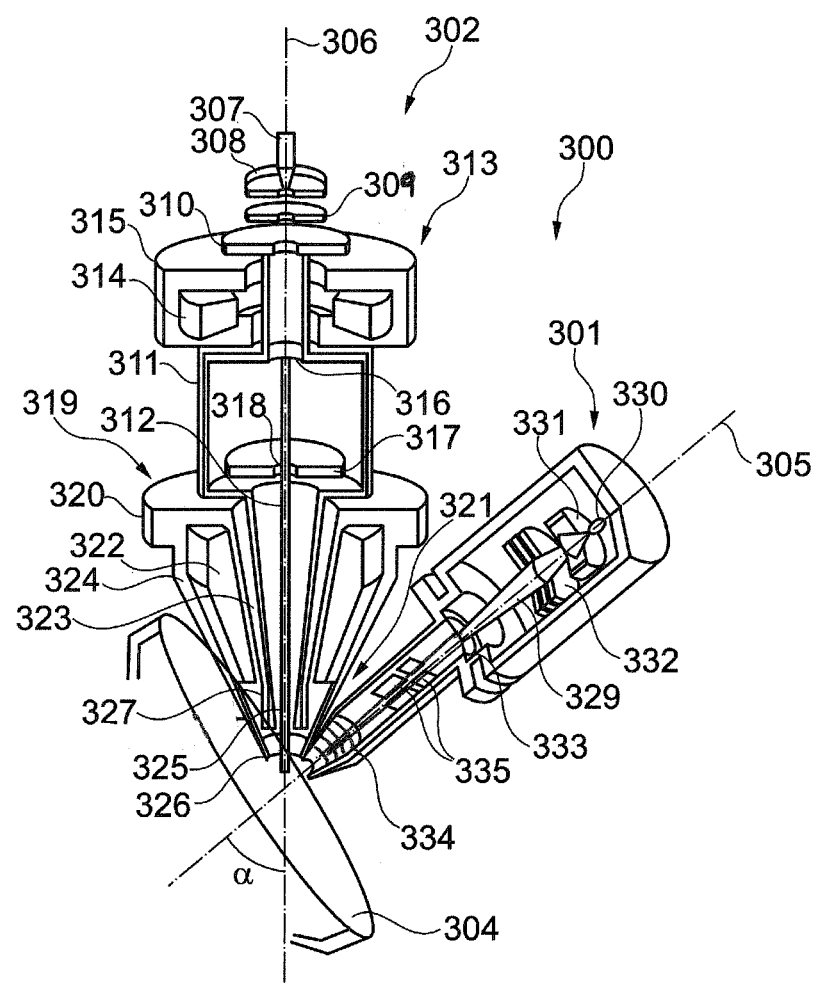
FIG. 4 shows a further schematic representation of the particle beam device according to FIG. 3.

FIG. 4 shows a detailed illustration of the particle beam device 300 shown in FIG. 3. For clarity reasons, the object chamber 303 is not illustrated. The first particle beam column 301 in the form of the ion beam column has a first optical axis 305. Furthermore, the second particle beam column 302 in the form of the electron beam column has a second optical axis 306.

The second particle beam column 302, in the form of the electron beam column, will now be described in the following text. The second particle beam column 302 has a second beam generator 307, a first electrode 308, a second electrode 309 and a third electrode 310. By way of example, the second beam generator 307 is a thermal field emitter. The first electrode 308 has the function of a suppressor electrode, while the second electrode 309 has the function of an extractor electrode. The third electrode 310 is an anode, and at the same time forms one end of a beam guide tube 311.

A second particle beam 312 in the form of an electron beam is generated by the second beam generator 307. Electrons which emerge from the second beam generator 307 are accelerated to the anode potential, for example in the range from 1 kV to 30 kV, as a result of a potential difference between the second beam generator 307 and the third electrode 310. The second particle beam 312 in the form of the electron beam passes through the beam guide tube 311, and is focused onto the object 304 to be analyzed and/or processed. This is described in more detail further below.

The beam guide tube 311 passes through a collimator arrangement 313 which has a first annular coil 314 and a yoke 315. Seen in the direction of the object 304, from the second beam generator 307, the collimator arrangement 313 is followed by a pinhole diaphragm 316 and a detector 317 with a central opening 318 arranged along the second optical axis 306 in the beam guide tube 311.

The beam guide tube 311 then runs through a hole in a second objective lens 319. The second objective lens 319 is used for focusing the second particle beam 312 onto the object 304. For this purpose, the second objective lens 319 has a magnetic lens 320 and an electrostatic lens 321. The magnetic lens 320 is provided with a second annular coil 322, an inner pole piece 323 and an outer pole piece 324. The electrostatic lens 321 includes an end 325 of the beam guide tube 311 and a terminating electrode 326.

The end 325 of the beam guide tube 311 and the terminating electrode 326 concurrently form an electrostatic deceleration device. The end 325 of the beam guide tube 311, together with the beam guide tube 311, is at the anode potential, while the terminating electrode 326 and the object 304 are at a potential which is lower than the anode potential. This allows the electrons of the second particle beam 312 to be decelerated to a desired energy which is required for examination of the object 304.

The second particle beam column 302 furthermore has a raster device 327, by which the second particle beam 312 can be deflected and can be scanned in the form of a raster over the object 304.

For imaging purposes, the detector 317 which is arranged in the beam guide tube 311 detects secondary electrons and/or backscattered electrons, which result from the interaction between the second particle beam 312 and the object 304. The signals generated by the detector 317 are transmitted to an electronic unit (not shown). The secondary electrons and/or backscattered electrons may also be detected by using an analysis detector 500 which is arranged in the object chamber 303 (see FIG. 3). The analysis detector 500 is positioned at the side of the object 304 and is directed with a detection surface 501 to the object 304. The structure of this analysis detector 500 is also explained further below.

The object 304 is arranged on an object holder 328 in the form of a sample stage as shown in FIG. 3, by which the object 304 is arranged such that it can move along three axes which are arranged to be mutually perpendicular (specifically an x-axis, a y-axis and a z-axis). Furthermore, the sample stage can be rotated about two rotation axes which are arranged to be mutually perpendicular. It is therefore possible to move the object 304 to a desired position. The rotation of the object holder 328 about one of the two rotation axes may be used to tilt the object holder 328 such that the surface of the object 304 may be oriented perpendicular to the second particle beam 312 or to the first particle beam 329, which will be described further below. Alternatively, the surface of the object 304 may be oriented in such a way that the surface of the object 304 on one hand and the first particle beam 329 or the second particle beam 312 on the other hand are at an angle, for example in the range of 0° to 90°.

As already mentioned above, reference symbol 301 denotes the first particle beam column, in the form of the ion beam column. The first particle beam column 301 has a first beam generator 330 in the form of an ion source. The first beam generator 330 is used for generating the first particle beam 329 in the form of an ion beam. Furthermore, the first particle beam column 301 is provided with an extraction electrode 331 and a collimator 332. The collimator 332 is followed by a variable aperture 333 in the direction of the object 304 along the first optical axis 305. The first particle beam 329 is focused onto the object 304 by a first objective lens 334 in the form of focusing lenses. Raster electrodes 335 are provided, in order to scan the first particle beam 329 over the object 304 in the form of a raster.

When the first particle beam 329 strikes the object 304, the first particle beam 329 interacts with the material of the object 304. In the process, interaction radiation particles and interaction particles are generated, in particular secondary electrons and/or secondary ions. The secondary electrons and/or secondary ions are detected using the detector 317 or using the analysis detector 500 which is arranged in the object chamber 303.

The object chamber 303 is operated in a first pressure range or in a second pressure range, wherein the first pressure range only includes pressures lower than or equal to $10^{-3}$ hPa and wherein the second pressure range only includes pressures equal to or over $10^{-3}$ hPa. A pressure sensor 600 is arranged in the object chamber 303 for measuring the pressure in the object chamber 303 (see FIG. 3). A pump system 601 being connected to the pressure sensor 600 and arranged at the object chamber 303 provides for the pressure range in the object chamber 303, either the first pressure range or the second pressure range.

The first particle beam 329 may also be used to process the object 304. For example, material may be deposited on the surface of the object 304 using the first particle beam 329, wherein the material is provided with a gas injection system (GIS). Additionally or alternatively, structures may be etched into the object 304 using the first particle beam 329. Moreover, the second particle beam 312 may be used to process the object 304, for example by electron beam induced deposition.

Figure 5:
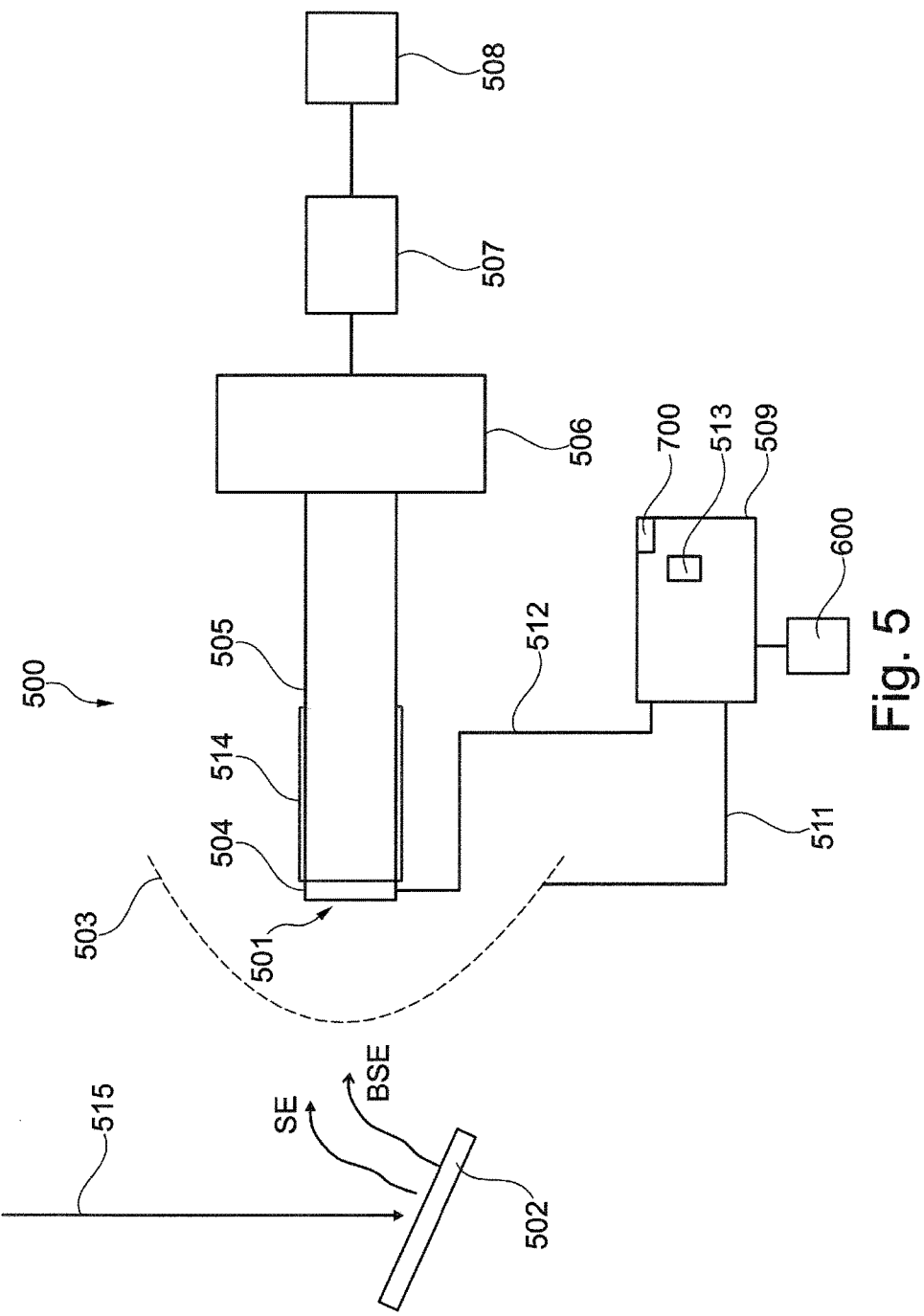
FIG. 5 shows a detection system having a detector used in a particle beam device according to an embodiment of the system described herein.

FIG. 5 shows an illustration of the analysis detector 500 as mentioned above. The analysis detector 500 is used to detect secondary electrons (SE) and backscattered electrons (BSE) which are generated when a primary electron beam, which is denoted with reference sign 515 in FIG. 5, interacts with an object to be examined which is denoted with reference sign 502 in FIG. 5. The primary electron beam 515 may be the primary electron beam of the SEM 100 according to FIG. 1 or 1A, the primary particle beam of the particle beam device 200 according to FIG. 2, the first particle beam or the second particle beam of the particle beam device 300 according to FIGS. 3 and 4.

The analysis detector 500 includes a collector electrode 503, a scintillator 504 and a light detector 505, which may be embodied as a photomultiplier. The scintillator 504 is arranged between the collector electrode 503 and the light detector 505. In particular, the scintillator 504 is arranged directly at the light detector 505. The collector electrode 503 is arranged at a given distance in front of the scintillator 504. The given distance is about 3 to 10 mm. The invention is not restricted to this given distance. Instead, any given distance may be chosen which is suitable for the invention.

The collector electrode 503 may have any suitable form. In particular, the collector electrode 503 may be a collector grid. Moreover, the scintillator 504 may have any suitable form and is made of any suitable material. In one embodiment, the scintillator 504 is made of the known scintillation material P-47.

The collector electrode 503 is connected to a power supply and control unit 509 of the particle beam device in which the analysis detector 500 is arranged via a first voltage supply line 511. The particle beam device is, for example, one of the above mentioned particle beam devices, namely the SEM 100 according to FIG. 1 or 1A, the particle beam device 200 according to FIG. 2 or the particle beam device 300 according to FIGS. 3 and 4.

Additionally, the scintillator 504 is connected to the power supply and control unit 509 of the particle beam device in which the analysis detector 500 is arranged via a second voltage supply line 512. The use of the first voltage supply line 511 and the second voltage supply line 512 is explained further below. The power supply and control unit 509 is also connected to the pressure sensor 600 being arranged in the object chamber 120 of the SEM 100 according to FIG. 1, in the object chamber 122 of the SEM 100 according to FIG. 1A, in the object chamber 226 of the particle beam device 200 according to FIG. 2 or in the object chamber 303 of the particle beam device 300 according to FIGS. 3 and 4. The pressure sensor 600 measures the pressure in the respective object chamber 120, 122, 226 or 303 and provides the measured data to the power supply and control unit 509.

The light detector 505 is connected to an amplifier 506 and provides a detection signal to the amplifier 506. The amplifier 506 amplifies the detection signal and provides the amplified detection signal to an image processing unit 507. The image processing unit 507 processes the amplified detection signal and generates an image of the surface of the object 502 and provides the generated image, for example, to the monitor 508.

In one exemplary embodiment, the light detector 505 might have on its outer surfaces a conductive coating 514, for example made of ITO (indium tin oxide). The conductive coating is used for chemical and mechanical resistance and may be also used for providing a bias voltage to the scintillator 504. The analysis detector 500 has no conductive coating on its detection surface 501.

The power supply and control unit 509 include a processor 513. A computer program product having a program code is loaded into the processor 513 and controls the particle beam device in which the analysis detector 500 is arranged. The controlling of the particle beam device is effected in such a way that a method according to the system described herein is carried out. This is explained in detail further below.

Figure 5A:
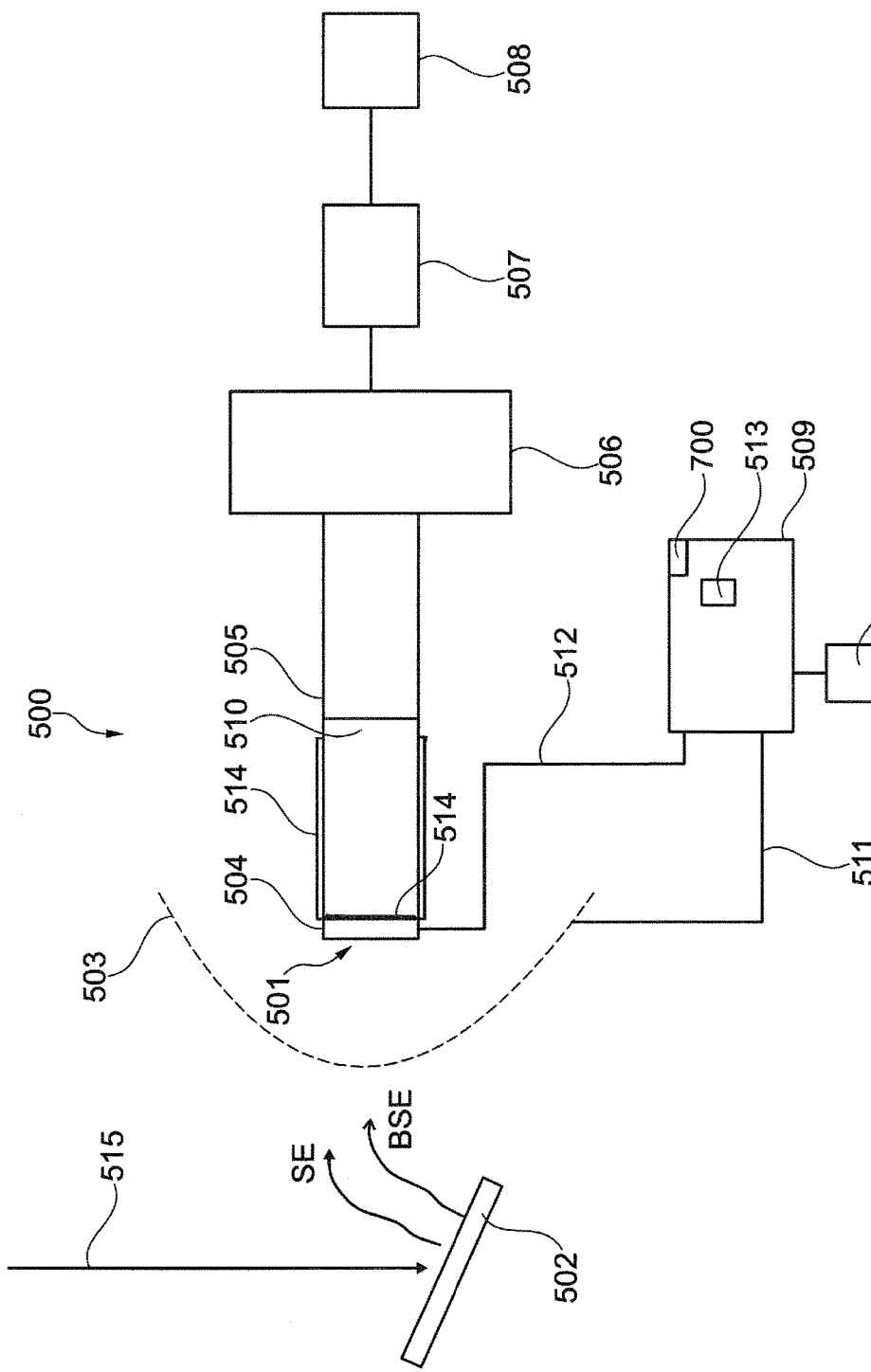
FIG. 5A shows a further detection system having a detector used in a particle beam device according to an embodiment of the system described herein.

FIG. 5A shows an illustration of a further embodiment of the analysis detector 500 as mentioned above. The embodiment of FIG. 5A is based on the embodiment of FIG. 5. All reference signs refer to the same parts of the analysis detector 500. The one difference is that a light guide 510 is arranged between the scintillator 504 and the light detector 505 in the embodiment of FIG. 5A. Moreover, the conductive coating 514 is also arranged between the scintillator 504 and the light guide 510.

FIGS. 6 to 9 show exemplary embodiments of the system described herein. The method is explained with respect to the SEM 100 as shown in FIG. 1. However, the method may also be carried out with any other suitable particle beam device, for example the SEM 100 shown in FIG. 1A, the particle beam device 200 shown in FIG. 2 or the particle beam device 300 shown in FIGS. 3 and 4.

Figure 6:
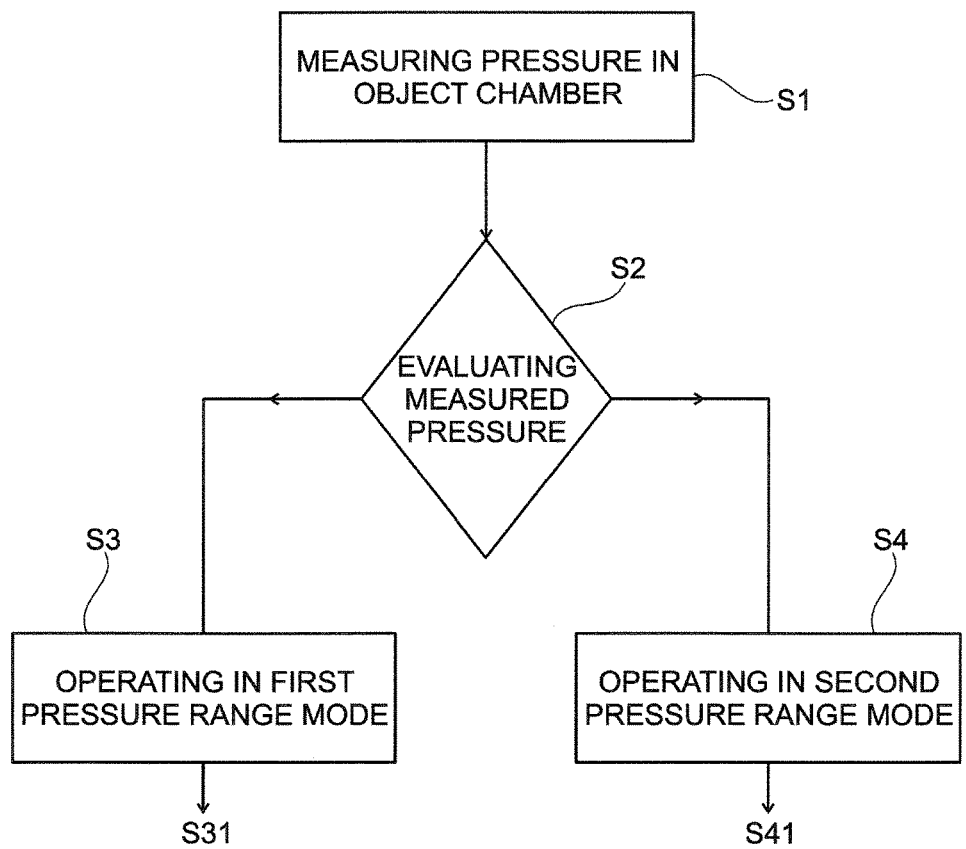
FIG. 6 shows a schematic view of a flow chart of method steps of one embodiment of the method according to an embodiment of the system described herein.

FIG. 6 shows a schematic view of a flow chart of steps according to the system described herein. The pressure in the object chamber 120 is measured using the pressure sensor 600 arranged in object chamber 120 in a step S1. The measured pressure is evaluated as to whether it is in a first pressure range or in a second pressure range in a step S2. In one embodiment, the first pressure range only includes pressures lower than or equal to $10^{-3}$ hPa, and the second pressure range only includes pressures over $10^{-3}$ hPa. In a further embodiment, the first pressure range only includes pressures lower than $10^{-3}$ hPa, and the second pressure range only includes pressures equal to or over $10^{-3}$ hPa. If the measured pressure is in the first pressure range, the SEM 100 is operated in a first pressure range mode in a step S3. However, if the measured pressure is in the second pressure range, the SEM 100 is operated in a second pressure range mode in a step S4. Both the first pressure range mode and the second pressure range mode are explained further below.

Figure 7:
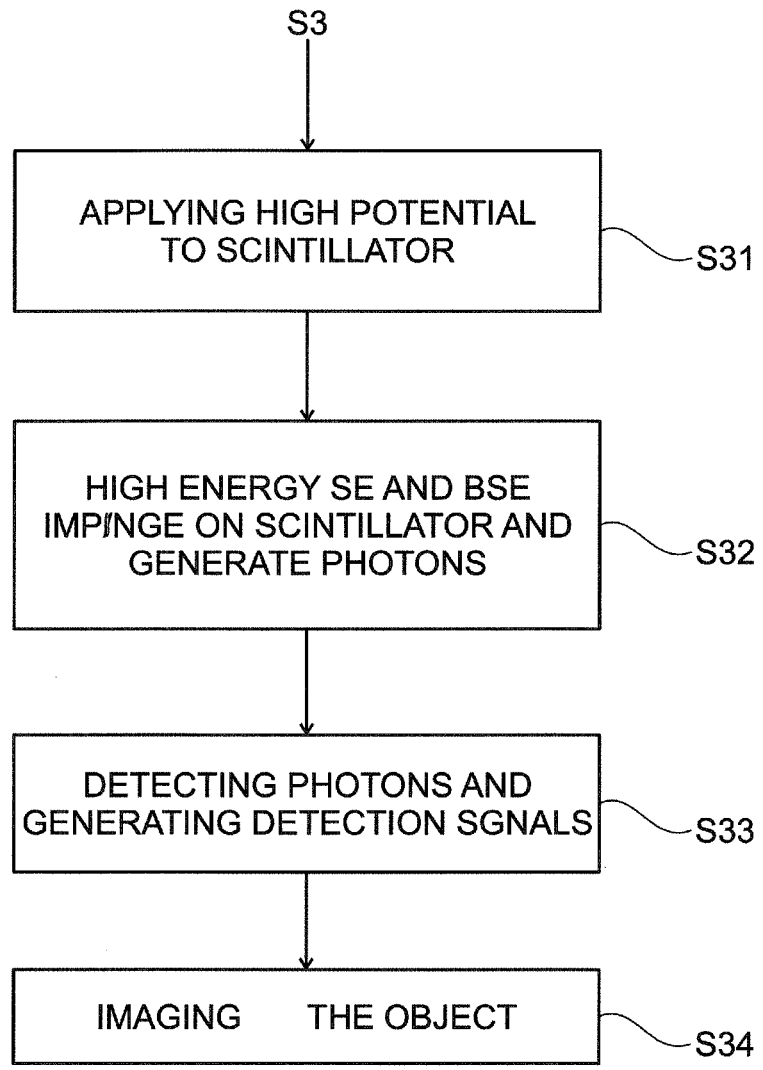
FIG. 7 shows a schematic view of a flow chart of method steps of one embodiment of the method operating a particle beam device in a first pressure range.

FIG. 7 shows a flow chart in a schematic view of the first pressure range mode. When the ambient pressure is equal to or lower than $10^{-3}$ hPa in the object chamber 120, the analysis detector 500 is used in a manner analogous to the mode of operation of an ETD. A high potential, for example a potential between 5 kV and 15 kV, is applied to the scintillator 504 by the power supply and control unit 509 via the second voltage supply line 512 in a step S31. Secondary electrons and backscattered electrons are attracted away from the object 114 using the collector electrode 503. The collector electrode 503 is applied with a specific acceleration voltage by the power supply and control unit 509. The secondary electrons and backscattered electrons impinge on the scintillator 504 and generate photons in the scintillator 504 in a step S32. The photons are detected using the light detector 505 in a further step S33. Moreover, detection signals are generated and amplified using the amplifier 506 which is connected to the light detector 505. The amplifier 506 amplifies the detection signals and provides the amplified detection signals to the image processing unit 507. The image processing unit 507 processes the amplified detection signals and generates an image of the surface of the object 114 in a step S34. The generated image is shown on the monitor 508.

Figure 8:
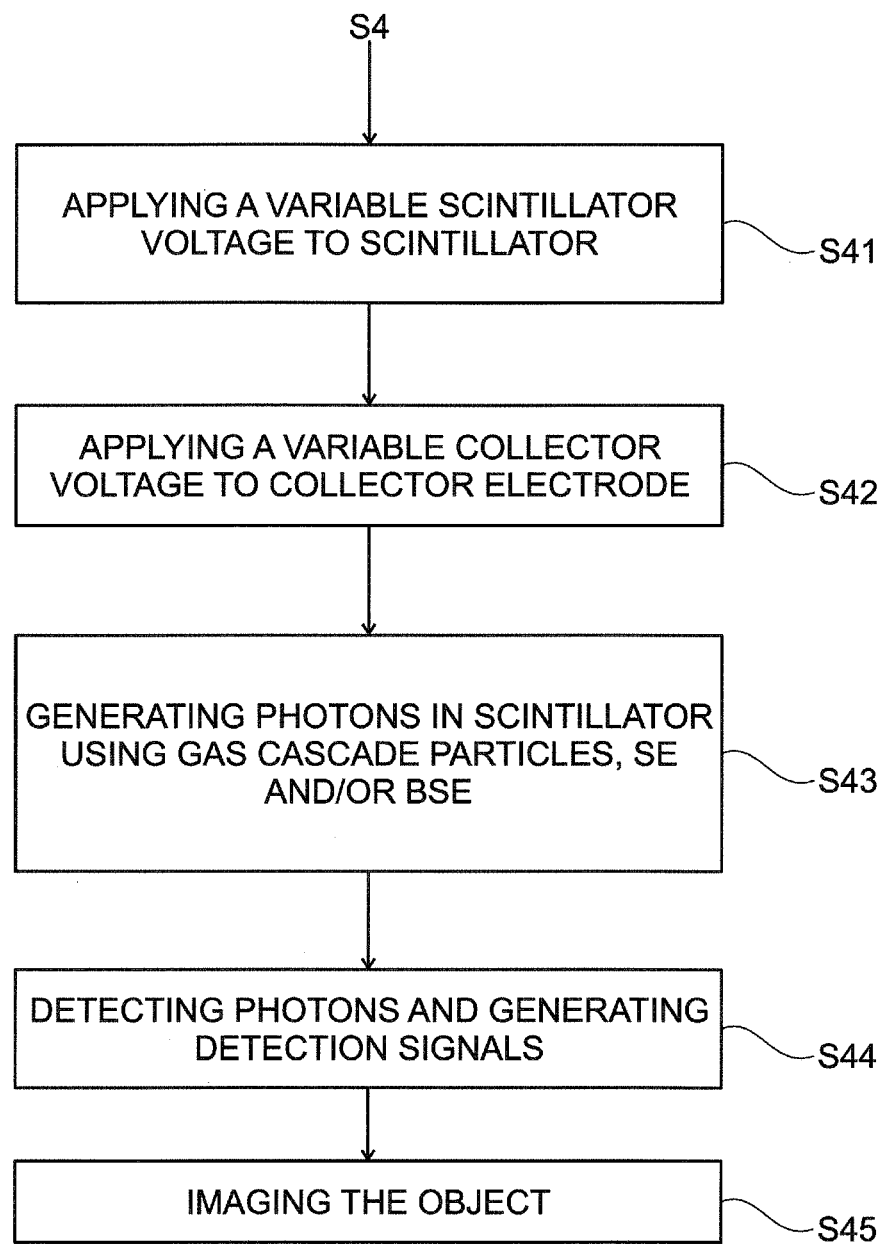
FIG. 8 shows a schematic view of a flow chart of method steps of one embodiment of the method operating a particle beam device in a second pressure range.

FIG. 8 shows a flow chart in a schematic view of the second pressure range mode. When the ambient pressure in the object chamber 120 is above $10^{-3}$ hPa, the identical detection principle is used. However, in a step S41, a variable scintillator voltage is applied to the scintillator 504 by the power supply and control unit 509 via the second voltage supply line 512. Furthermore, a variable collector voltage is applied to the collector electrode 503 by the power supply and control unit 509 via the first voltage supply line 511 in method step S42.

The variable scintillator voltage is chosen from a range of 200 V to 10 kV. No breakdown in the object chamber 120 occurs at the chosen value of the variable scintillator voltage. Moreover, a charged particle amplification using a particle cascade (namely an electron cascade) in the gas occurs at the chosen value of the variable scintillator voltage. The gas is, for example, ambient air in the object chamber 120.

The variable collector voltage is chosen from a range of 0 V to 1 kV. Moreover, no breakdown in the object chamber 120 occurs at the chosen value of the variable collector voltage and/or a charged particle amplification using a particle cascade (namely the electron cascade) in the gas occurs at the chosen value of the variable collector voltage.

Charged particles, in particular, high energy charged particles, for example backscattered electrons having an energy above approximately 1 keV and travelling in the direction of the scintillator 504 generate photons in the scintillator 504 when impinging on the scintillator 504 in a step S43. Moreover, in the step S43, charged particles, in particular low energy charged particles, for example secondary electrons having an energy lower than approximately 1 keV, are accelerated towards the collector electrode 503, collide with gas molecules of a gas, for example ambient air, in the object chamber 120 and generate a particle cascade in the form of an electron cascade. Cascade charged particles, in particular tertiary electrons, arise in this particle cascade. For example, due to the amplification process in the particle cascade, the final number of the cascade charged particles is, for example, about 1000 times higher than the initial number of secondary particles (in particular secondary electrons) emitted from the object 114. The gas cascade charged particles are accelerated to the scintillator 504 by the collector electrode 503 and generate photons in the scintillator 504 when impinging on the scintillator 504. The high number of cascade charged particles impinging on the scintillator 504 compensates for the reduced photon generation efficiency in the scintillator 504 due to the low energy of the cascade charged particles.

The photons are detected using the light detector 505 in a further step S44. Moreover, detection signals are generated and amplified using the amplifier 506 which is connected to the light detector 505. The amplifier 506 provides the amplified detection signals to the image processing unit 507. The image processing unit 507 processes the amplified detection signals and generates an image of the surface of the object 114 in a step S45. The generated image is shown on the monitor 508.

Figure 9:
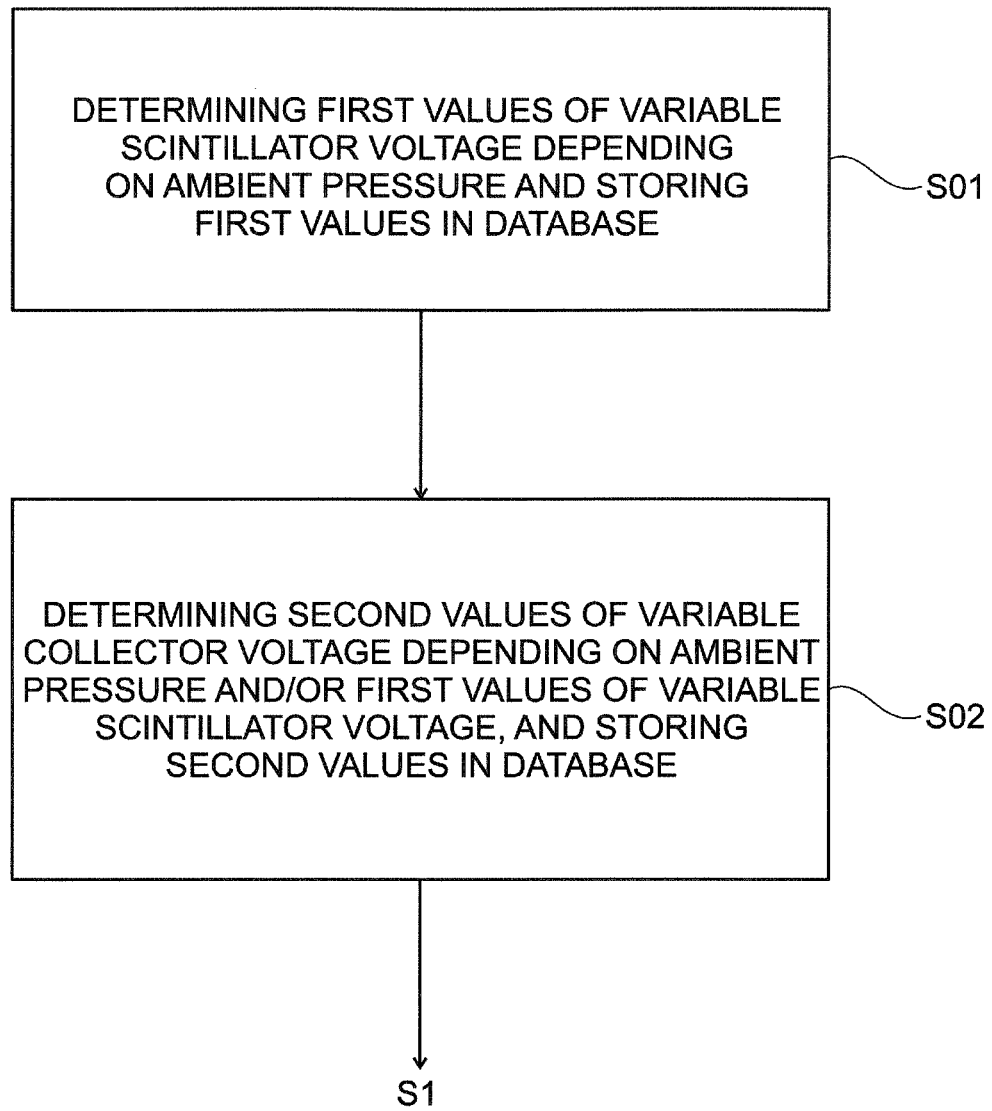
FIG. 9 shows a schematic view of a flow chart of method steps of one embodiment of the method obtaining values of a variable scintillator voltage and of a variable collector voltage.

FIG. 9 shows a flow chart in a schematic view of two steps which may be carried out before the step S1 in one embodiment of the system described herein. In a step S01, first values of the variable scintillator voltage are determined by an experimental study and depending on the ambient pressure in the object chamber 120. Therefore, there exist several first values of the variable scintillator voltage, wherein each first value of the variable scintillator voltage corresponds to a specific ambient pressure value. The first values of the variable scintillator voltage are determined in such a way that no breakdown in the object chamber 120 occurs at the first value of the variable scintillator voltage. Moreover, a charged particle amplification using a particle cascade in the form of an electron cascade in the gas occurs at the first value of the variable scintillator voltage. Each first value of the variable scintillator voltage and its corresponding ambient pressure value are stored in a database 700 of the power supply and control unit 509 (see FIG. 5).

In a step S02, second values of the variable collector voltage are determined by an experimental study and depending on the ambient pressure in the object chamber 120 and/or on the first values of the variable scintillator voltage. Therefore, there exist several second values of the variable collector voltage, wherein each second value of the variable collector voltage corresponds to a specific ambient pressure value and/or to a first value of the variable scintillator voltage. The second values of the variable collector voltage are determined in such a way that no breakdown in the object chamber 120 occurs at the second value of the variable collector voltage. Moreover, a charged particle amplification using a particle cascade in the form of an electron cascade in the gas occurs at the second value of the variable collector voltage. Each second value of the variable collector voltage and its corresponding ambient pressure value and/or first value of the variable scintillator voltage are stored in the database 700 of the power supply and control unit 509.

The database 700 may be a single database or may include a first database for storing the first values of the variable scintillator voltage and a second database for storing the second values of the variable collector voltage. Moreover, the database may use triplets of data, each triplet including an ambient pressure value and its corresponding first value of the variable scintillator voltage and its corresponding second value of the variable collector voltage. The first value and the second value are determined as mentioned above.

The described embodiment includes, in a step S41, loading the first value of the variable scintillator voltage corresponding to the measured pressure into the power supply and control unit 509. The first value is applied to the scintillator 504. Moreover, in a step S42, the second value of the variable collector voltage corresponding to the measured pressure and/or to the corresponding first value of the variable scintillator voltage is loaded into the power supply and control unit 509. The second value is applied to the collector electrode 503.

Figure 10:
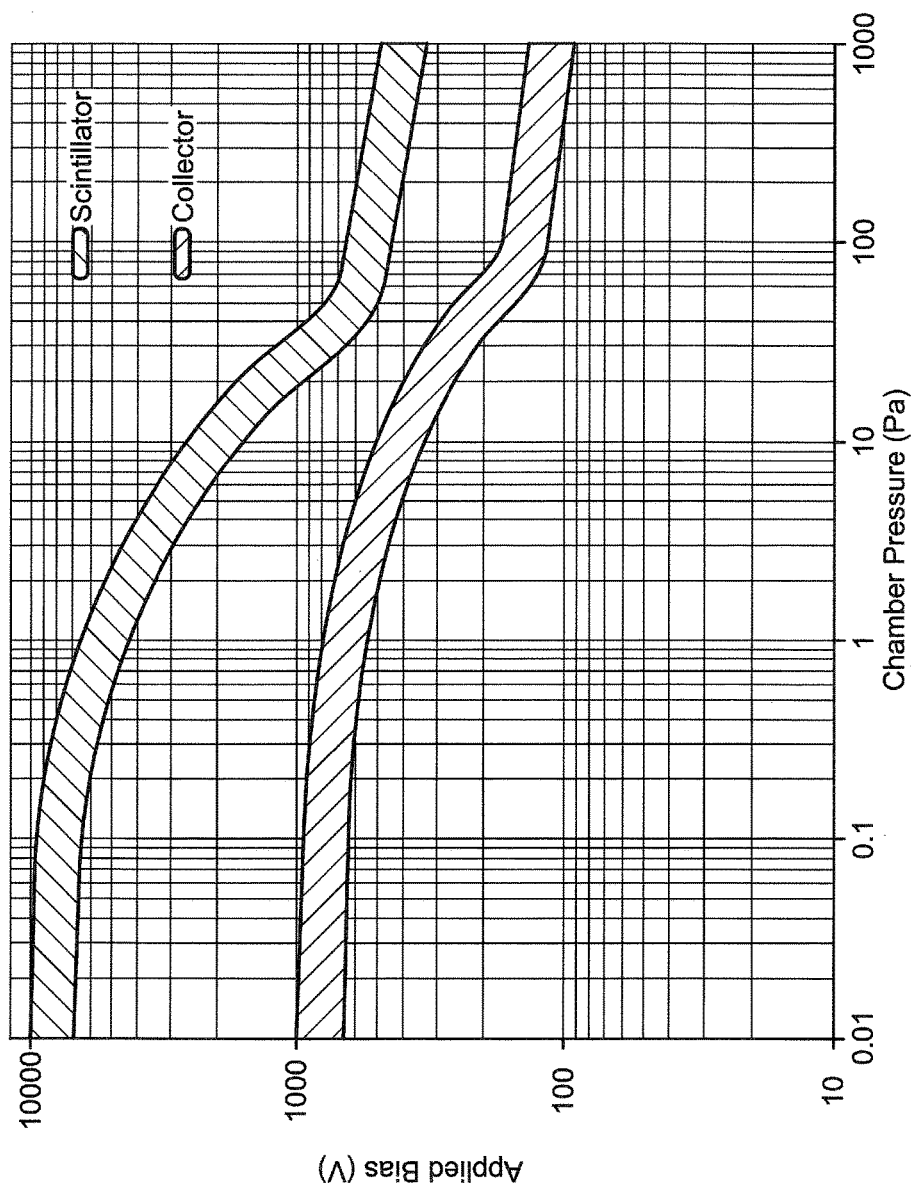
FIG. 10 shows a schematic diagram showing the variable scintillator voltage and the variable collector voltage dependent on the ambient pressure in an object chamber of a particle beam device.

FIG. 10 shows a schematic view of a diagram showing the variable scintillator voltage and the variable collector voltage dependent on the ambient pressure in the object chamber 120. The shown first values of the variable scintillator voltage and the shown second values of the variable collector voltage are the threshold values for the specific ambient pressure for which no breakdown occurs in the object chamber 120.

All embodiments of the system described herein allow for detecting charged particles with the same detection principle when the ambient pressures in the object chamber 120 are equal to or above $10^{-3}$ hPa as well as lower than $10^{-3}$ hPa.

Other embodiments of the invention will be apparent to those skilled in the art from a consideration of the specification and/or an attempt to put into practice the invention disclosed herein. It is intended that the specification and examples be considered as exemplary only, with the true scope and spirit of the invention being indicated by the following claims.

What is claimed is:

1. A method for detecting charged particles comprising:
    operating an object chamber in a first pressure range that only includes pressures equal to or over $10^{-3}$ hPa, wherein the object chamber includes at least one collector electrode, at least one scintillator and at least one light detector, and wherein the at least one scintillator is arranged between the at least one collector electrode and the at least one light detector
    when operating the object chamber in the first pressure range, generating photons in the at least one scintillator using cascade particles generated by using the charged particles and a gas; and
    detecting the photons generated during operation in the first pressure range using the at least one light detector.

2. The method according to claim 1, further comprising:
    operating the object chamber in a second pressure range that only includes pressures lower than or equal to $10^{-3}$ hPa;
    when operating the object chamber in the second pressure range, generating photons in the at least one scintillator using the charged particles; and
    detecting the photons generated during operation in the second pressure range using the at least one light detector.

3. The method according to claim 1, wherein a variable scintillator voltage is applied to the at least one scintillator, and wherein the variable scintillator voltage is chosen from a range of 200 V to 10 kV.

4. The method according to claim 3, further comprising:
    choosing a first value of the variable scintillator voltage from a first database, wherein no breakdown in the object chamber occurs at the first value of the variable scintillator voltage and/or wherein a charged particle amplification using a particle cascade in the gas occurs at the first value of the variable scintillator voltage.

5. The method according to claim 3, further comprising:
    measuring a pressure in the object chamber; and
    determining that the pressure is in the first pressure range, wherein the variable scintillator voltage is applied based on the determination.

6. The method according to claim 1, wherein a variable collector voltage is applied to the at least one collector electrode, and wherein the variable collector voltage is chosen from a range of 0 V to 1 kV.

7. The method according to claim 6, further comprising:
    choosing a second value of the variable collector voltage from a second database, wherein no breakdown in the object chamber occurs at the second value of the variable collector voltage and/or wherein a charged particle amplification using a particle cascade in the gas occurs at the second value of the variable electrode voltage.

8. The method according to claim 7, wherein the first database and the second database are identical.

9. The method according to claim 6, further comprising:
    measuring a pressure in the object chamber; and
    determining that the pressure is in the first pressure range, wherein the variable collector voltage is applied based on the determination.

10. The method according to claim 1, wherein charged particles in the form of electrons are detected.

11. The method according to claim 1, wherein interaction particles are detected.

12. The method according to claim 1, wherein charged particles in the form of secondary electrons are detected.

13. A non-transitory computer readable medium containing software that controls a particle beam device to detect charged particles, the software comprising:
    executable code that controls operation of an object chamber in a first pressure range that only includes pressures equal to or over $10^{-3}$ hPa, wherein the operating chamber includes at least one collector electrode, at least one scintillator and at least one light detector, and wherein the at least one scintillator is arranged between the at least one collector electrode and the at least one light detector;
    executable code that controls generating photons in the at least one scintillator when operating the object chamber in the first pressure range using cascade particles generated by using the charged particles and a gas; and
    executable code that controls detecting the photons generated during operation in the first pressure range using the at least one light detector.

14. The non-transitory computer readable medium according to claim 13, wherein the software further comprises:
    executable code that controls operating the object chamber in a second pressure range that only includes pressures lower than or equal to $10^{-3}$ hPa;
    executable code that controls generating photons in the at least one scintillator when operating the object chamber in the second pressure range using the charged particles; and
    executable code that controls detecting the photons generated during operation in the second pressure range using the at least one light detector.

15. The non-transitory computer readable medium according to claim 13, wherein the software further comprises:
    executable code that measures a pressure in the object chamber;
    executable code that determines that the pressure is in the first pressure range; and
    executable code that applies a variable scintillator voltage to the at least one scintillator based on the determination.

16. A particle beam device, comprising
    at least one beam generator for generating a primary particle beam comprising primary charged particles;
    at least one objective lens for focusing the primary particle beam on an object;
    at least one object chamber;
    at least one detector for detecting interaction particles which are generated when the primary particle beam impinges on the object, wherein the at least one detector is arranged in the object chamber, wherein the at least one detector includes at least one collector electrode, at least one scintillator and at least one light detector, and wherein the at least one scintillator is arranged between the at least one collector electrode and the at least one light detector; and at least one processor into which a computer program product is loaded, the computer program product being provided by a non-transitory computer readable medium containing software that controls the particle beam device to detect charged particles, the software including executable code that controls: operating the object chamber in a first pressure range that only includes pressures equal to or over $10^{-3}$ hPa, generating photons in the at least one scintillator when operating the object chamber in the first pressure range using cascade particles generated by using the charged particles and a gas, and detecting the photons generated during operation in the first pressure range using the at least one light detector.

17. The particle beam device according to claim 16, wherein the at least one detector is a first detector, and the particle beam device further includes at least one second detector for detecting at least one of: interaction particles or interaction radiation which are generated when the primary particle beam impinges on the object.

18. The particle beam device according to claim 16, wherein the at least one beam generator is a first beam generator and wherein the primary particle beam is a first primary particle beam including first primary charged particles, the particle beam device further including at least one second beam generator for generating a second primary particle beam having second primary charged particles.

19. The particle beam device according to claim 16, wherein the particle beam device is at least one of the following: an electron beam device or an ion beam device.

20. The particle beam device according to claim 16, wherein the software further comprises:
executable code that controls operation of the object chamber in a second pressure range that only includes pressures lower than or equal to $10^{-3}$ hPa;
executable code that controls generating photons in the at least one scintillator when operating the object chamber in the second pressure range using the charged particles; and
executable code that controls detecting the photons generated during operation in the second pressure range using the at least one light detector.

* * * * *